United States Patent
Fox et al.

(10) Patent No.: US 7,915,931 B2
(45) Date of Patent: Mar. 29, 2011

(54) POWER SEQUENCING WITH LOGIC ENABLED REGULATOR

(75) Inventors: Jerry Fox, San Diego, CA (US); Paul D Young, El Cajon, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 150 days.

(21) Appl. No.: 12/361,696

(22) Filed: Jan. 29, 2009

(65) Prior Publication Data
US 2010/0188123 A1    Jul. 29, 2010

(51) Int. Cl.
*H03L 7/00*    (2006.01)
(52) U.S. Cl. .................... 327/143; 327/142; 327/198
(58) Field of Classification Search .................. 327/142, 327/143, 198
See application file for complete search history.

(56) References Cited

U.S. PATENT DOCUMENTS

| | | | |
|---|---|---|---|
| 3,703,648 A * | 11/1972 | Wrabel | 327/143 |
| 4,246,634 A | 1/1981 | Purol | |
| 4,642,746 A | 2/1987 | Losel | |
| 5,834,964 A | 11/1998 | Scheraga | |
| 7,256,778 B1 * | 8/2007 | Choi | 345/213 |
| 2004/0251883 A1 | 12/2004 | Brosh et al. | |
| 2007/0103948 A1 | 5/2007 | Patchornik | |

* cited by examiner

*Primary Examiner* — Lincoln Donovan
*Assistant Examiner* — John W Poos
(74) *Attorney, Agent, or Firm* — Nathan R. Rieth (57) ABSTRACT

A power sequencing circuit includes a PNP transistor, a first, second and third resistor, and a logic enabled regulator. A voltage is coupled at a first node to the emitter of the transistor, the first resistor is coupled between the first node and the base of the transistor, the second resistor is coupled between the base and a grounded node, the third resistor is coupled between the grounded node and the collector of the transistor, and the logic enabled regulator has an enable pin coupled to and driven by the collector.

12 Claims, 6 Drawing Sheets

POWER SEQUENCING WITH LOGIC ENABLED REGULATOR

BACKGROUND

Internal circuits in many devices such as computers, printers, liquid crystal displays, etc., use multiple DC voltage levels that must be powered on, and/or off, in a specific sequence in order to ensure proper functionality and to avoid damage to the circuitry. For example, LCD (liquid crystal display) drive circuits often have one or more negative bias voltages, a digital logic voltage and yet another analog power supply. Bringing voltage levels up in an improper sequence in such circuits can result in unintended paths for current flow when parasitic diodes within IC's are biased into conduction by the unbalanced voltage levels. This can cause a latch-up condition, possibly resulting in overheating and eventual component meltdown. The manufacturers of such circuits specify the order in which the various voltage supplies should be energized, and it is up to the designer of the power circuit to find a way to meet that specification.

Various methods of providing power sequencing have been used previously. For example, when the required sequencing of power runs from highest level first to lowest level last, a simple cascading of voltage regulators can be used whereby the output of the regulator supplying the highest voltage rail is used as the input to the regulator supplying the next lowest voltage rail, and so on, down to the lowest voltage level needed. The problem with this solution is that the first regulator in the chain must not only supply the current for its primary voltage rail, but it must also supply the current needed for every lower voltage rail as well. Even with the reduced voltage drop at each successive stage, the additional current draw can quickly require larger, more expensive parts and/or added heat sinking devices. In addition, the reduced voltage drop between stages will likely require the use of more expensive LDO (low dropout) regulators.

Another alternative for sequencing multiple voltage levels is to add an RC filter on the output of a second voltage rail, for example, to slow its rise-time with respect to a first voltage rail. Although quite simple to implement, this solution has a number of drawbacks, including its dependence on the original rise-times of each of the voltage rails, the power and voltage loss in the RC filter resistor, the inability to clamp the delayed second rail voltage if the first voltage rail does not come up, and the second filtered voltage rail being held up longer than the first voltage rail upon powerdown.

Other solutions for sequencing multiple voltage levels include the use of voltage monitor IC's, dedicated voltage sequencing IC's and suitably programmed microcontroller I/O ports. However, these solutions have drawbacks including higher costs, additional space required for active components and increased complexity.

BRIEF DESCRIPTION OF THE DRAWINGS

The present embodiments will now be described, by way of example, with reference to the accompanying drawings, in which.

DETAILED DESCRIPTION

Overview of Problem and Solution

As noted above, in addition to the use of RC filters and simple cascaded voltage regulators, solutions for providing power sequencing for devices using multiple DC voltage levels can include the use of voltage monitor IC's, dedicated voltage sequencing IC's and suitably programmed microcontroller I/O ports. The outputs of such IC's and microcontroller ports may drive, for example, the Enable pin of a logic enabled regulator or a series pass FET (through a charge pump) in line with the controlled voltage rail. Embodiments of the present disclosure are concerned with the use of the logic enabled regulator for providing power sequencing.

The voltage range over which the Enable pin of a logic enabled regulator operates to turn on the regulator and begin regulating the output voltage can be quite large relative to the voltage supply rails being sequenced. For example, a typical logic enabled regulator regulating an input voltage rail of 3.3 volts down to an output voltage rail of 1.8 volts may specify a voltage range at the Enable pin between 0.3 and 1.3 volts over which the regulator is in an unknown state. Therefore, when the Enable pin is driven between 0.3 and 1.3 volts, the regulator output voltage could either be unregulated (e.g., zero volts), regulated (e.g., 1.8 volts), or somewhere in between. Accordingly, in order to properly sequence the input voltage rail to the regulator output voltage rail, the voltage at the Enable pin of the regulator typically needs to be tightly controlled with respect to the rising and falling input voltage rail.

Such tight control of the voltage level at the Enable pin of a logic enabled regulator has previously required the use of supervisor circuits such as voltage monitor IC's, dedicated voltage sequencing IC's and suitably programmed microcontroller I/O ports, as noted above. Various disadvantages accompany the use of such circuits, however, including the complexity of the circuits, the high cost of the IC's and additional components, and the large amount of circuit board space required to implement the circuits.

Embodiments of the present disclosure overcome the disadvantages associated with the use of complex supervisor circuits to control logic enable regulators for power sequencing in devices that use multiple DC voltage levels. In one embodiment, for example, a power sequencing circuit uses a transistor as a controlled threshold switch to control a logic enabled regulator. In this embodiment, just three resistors and a common PNP transistor are used in the power sequencing circuit to drive the Enable pin of the logic enabled regulator. A voltage is coupled at a first node to the emitter of the PNP transistor and to a first resistor. The first resistor is coupled between the first node and the base of the transistor, the second resistor is coupled between the base and a grounded node, and the third resistor is coupled between the grounded node and the transistor's collector. The collector is coupled to and drives the enable pin of the logic enabled regulator.

In another embodiment, an apparatus includes a plurality of power sequencing circuits wherein first and second power sequencing circuits are coupled in series with one another. In this embodiment, each of the plurality of power sequencing circuits includes a voltage coupled at a first node to the emitter of a PNP transistor, a first resistor coupled between the first node and the base of the transistor, a second resistor coupled between the base and a grounded node, a third resistor coupled between the grounded node and the collector of the transistor, and a logic enabled regulator having an enable pin coupled to and driven by the collector. In this embodiment, the voltage in a second power sequencing circuit is coupled to and driven by an output voltage from the logic enabled regulator of a first power sequencing circuit, thereby coupling the first and second circuits in series with one another. In an alternate implementation of this embodiment, the voltage in the first and second power sequencing circuits is the same voltage, thereby coupling the first and second power sequencing circuits in parallel.

In still another embodiment, a method of power sequencing voltage rails includes increasing a voltage at a first voltage rail V1 and sequencing the regulation of a second voltage rail V2 with respect to V1 such that V2 is not regulated until V1 reaches a minimum threshold voltage. The sequencing includes driving an enable pin of a logic enabled regulator with a PNP transistor switch to control when the regulation of V2 occurs.

First Illustrative Embodiment

Figure 1:
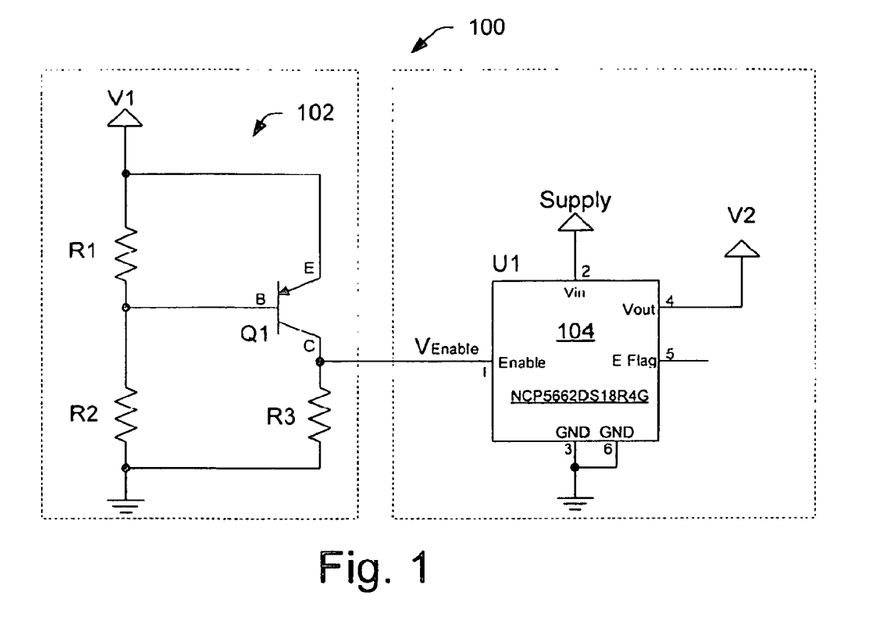
FIG. 1 shows an example power sequencing circuit according to an embodiment.

FIG. 1 shows an example power sequencing circuit 100 according to one embodiment. The circuit 100 includes a sequencer 102 and a logic enabled regulator 104. The sequencer 102 is a circuit made up of three resistors (R1, R2 and R3) and a PNP transistor (Q1) configured as a controlled threshold switch to drive the enable pin of the logic enabled regulator (U1) 104. In the sequencer 102, a voltage rail V1 is coupled at a first node to one side of R1 and to the emitter of transistor Q1. The base of Q1 is coupled to the other side of R1 and to one side of R2. The other side of R2 is coupled to ground. The collector of Q1 is coupled to the enable pin (shown as pin 1) of the logic enabled regulator 104, and to one side of R3. The other side of R3 is coupled to ground.

The logic enabled regulator 104, illustrated by way of example in FIG. 1 as part number NCP5662DS18R4G, includes a supply (shown at pin 2, Vin), an enable pin (pin 1) coupled to the collector of Q1 and an output rail voltage, V2, shown as Vout at pin 4. Regulator 104 is also grounded at pins 3 and 6.

Figure 2:
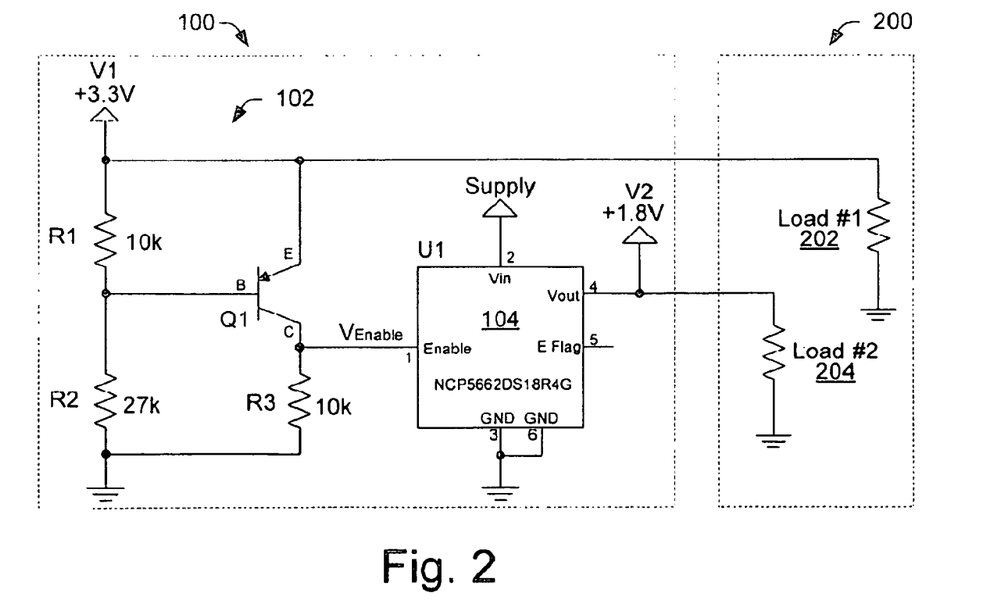
FIG. 2 shows the example power sequencing circuit of FIG. 1 with voltage rails coupled to example load circuits according to an embodiment.

The sequencer 102 portion of power sequencing circuit 100 is designed in conjunction with parameters specified for the logic enabled regulator (U1) 104 and the load circuits being driven by voltage rails V1 and V2. FIG. 2 illustrates power sequencing circuit 100 in an operation mode with example component values and voltage values for rails V1 and V2, discussed below, driving example load circuits 202 and 204 in a black box apparatus 200. The example apparatus 200 containing example load circuits 202 and 204 may be a device such as a computer, printer, liquid crystal display, etc., and load circuits 202 and 204 may require different DC voltage levels to be powered on, and/or off, in a specific sequence specified by the manufacturer of the apparatus 200 in order to ensure proper functionality and to avoid damage to the circuits.

Figure 3:
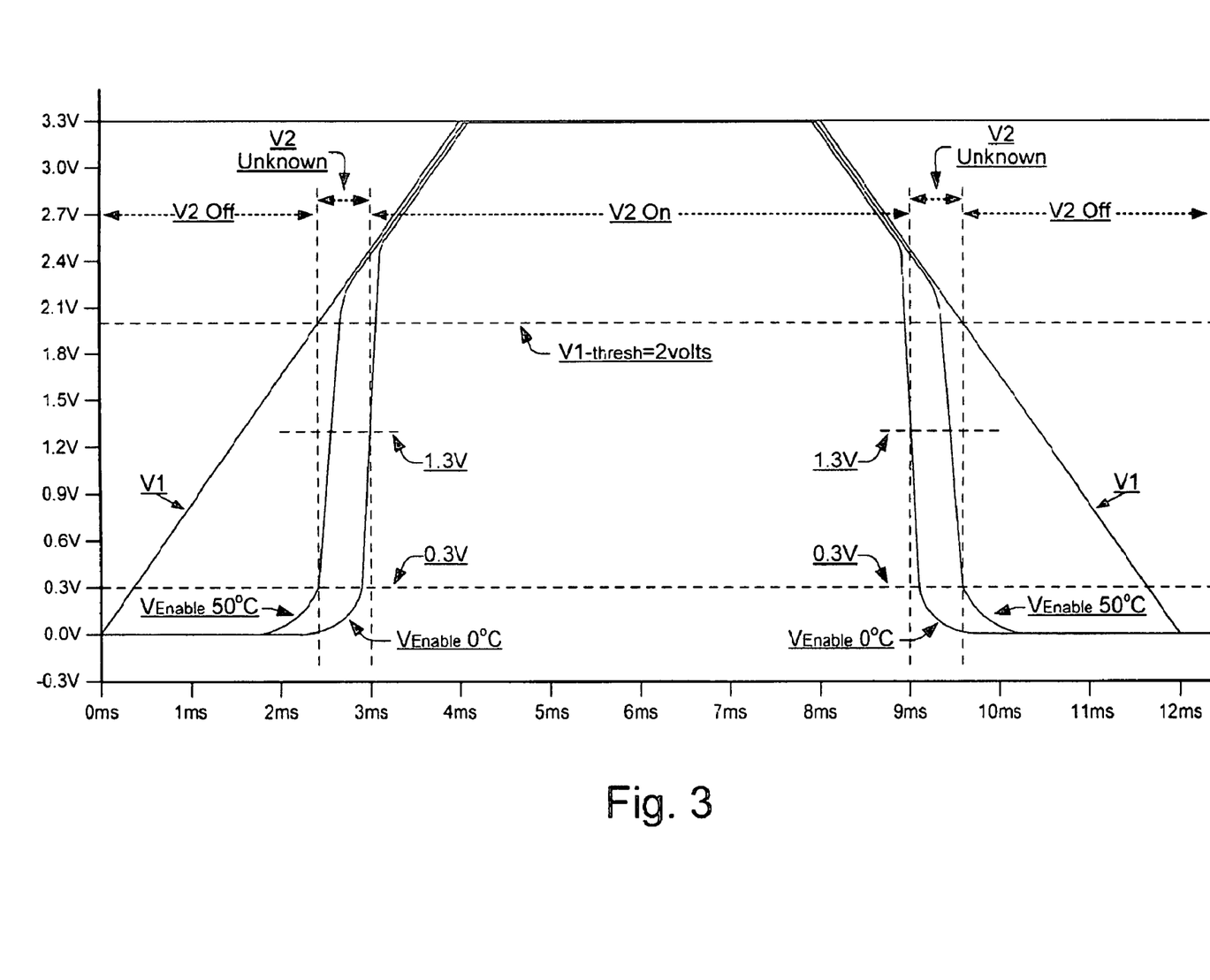
FIG. 3 shows an example simulation of voltage level sequencing in an embodiment of a power sequencing circuit.

FIG. 3 shows an example simulation of voltage level sequencing in one embodiment of a power sequencing circuit such as the circuits of FIGS. 1 and 2. In the example simulation of FIG. 3, it is assumed that the manufacturer of a black box apparatus 200 has specified that the voltage rail V1 supplying load #1 (202) is 3.3 volts and that the voltage rail V2 supplying load #2 (204) is 1.8 volts. It is further assumed that the manufacturer of apparatus 200 has specified that upon circuit power up, the voltage rail V1 supplying load #1 (202) must be at least as high as 1.8 volts before the voltage rail V2 supplying load #2 (204) is allowed to reach 1.8 volts, and that upon circuit power down the rail V2 be turned off before rail V1 is allowed to drop back below 1.8 volts. Accordingly, as voltage rail V1 is powered on in the power sequencing circuit 100 (FIGS. 1 and 2), the logic enabled regulator 104 should be kept off (i.e., not be permitted to regulate 1.8 volts at V2) until such time as V1 rises to at least 1.8 volts. In addition, on circuit power down, the regulator 104 should be kept on only while rail V1 is still above 1.8 volts but be turned off when V1 drops below 1.8 volts.

The power sequencing circuit 100 (FIGS. 1 and 2) can be set up to achieve this and other similar results as discussed herein. Initially, it is understood that the enable pins (e.g., pin 1) on various logic enabled regulators such as regulator 104 have a relatively large voltage range over which they will turn on the regulator 104. For example, in an embodiment using part number NCP5662DS18R4G, the regulator 104 may begin regulating 1.8 volts at Vout (i.e., pin 4; voltage rail V2) when the enable pin (pin 1) ($V_{Enable}$) is driven between 0.3 and 1.3 volts. Because of this wide voltage range, $V_{Enable}$ needs to be tightly controlled to avoid turning on regulator 104 and regulating 1.8 volts at rail V2 too soon.

As noted above, the sequencer 102 portion of power sequencing circuit 100 is designed based in part on parameters of the logic enabled regulator 104 and other parameters specified by the manufacturer of load circuits 202 and 204 being driven by voltage rails V1 and V2. Because the manufacturer in this example has specified that the voltage rail V1 supplying load #1 (202) must be at least 1.8 volts before the voltage rail V2 supplying load #2 (204) can be allowed to reach 1.8 volts, a threshold voltage is set at V1 that ensures this result. In this example, a threshold voltage value at V1, called V1-thresh, is chosen to be 2 volts. Using 2 volts for V1-thresh in determining component values for sequencer 102 will ensure that the voltage at V1 meets or exceeds the manufacturer's specified minimum of 1.8 volts prior to allowing V2 to reach 1.8 volts.

Once V1-thresh has been set, the following equation and reasoning can then be applied to sequencer 102 to determine suitable values of R1, R2 and R3 that will configure the PNP transistor Q1 as a switch that properly controls when regulator 104 turns on:

$$R1/(R1+R2)=Vbe/V1\text{-thresh}$$

In this equation, Vbe is the Q1 base-emitter voltage needed to produce enough collector current through R3 to enable regulator 104 to regulate 1.8 volts at V2 (i.e., to turn on V2). Selecting a common resistance value of R3=10 k ohms, a voltage of Vbe=0.55 volts produces 30 uAmps of Q1 collector current flowing through R3, which provides the minimum $V_{Enable}$ threshold voltage of 0.3 volts at the enable pin (pin 1) of regulator 104. Therefore, resistors R1 and R2 must be selected to yield the desired voltage ratio of Vbe/V1-thresh=0.55V/2V=0.275. Again, common resistance values can be chosen for R1 and R2 to yield the desired ratio. In this case, values of R1=10 k ohms and R2=27 k ohms, as shown in FIG. 2, provide the proper voltage divider ratio.

Referring again to FIGS. 2 and 3, voltage rail V1 rises as power is supplied to sequencer 102. Initially, regulator 104 is in an off or disabled condition, which causes rail V2 at Vout (pin 4) to be off or unregulated. As V1 rises to V1-thresh=2 volts, the voltage divider ratio of R1/(R1+R2) meters Vbe to V1 and causes Vbe to rise to 0.55 volts. This allows 30 uAmps of Q1 collector current to flow through R3 and provides the minimum $V_{Enable}$ threshold voltage of 0.3 volts at the enable pin (pin 1) of regulator 104. Note in FIG. 3, that two extreme temperature scenarios for the $V_{Enable}$ threshold voltage are shown (i.e., 50° C. and 0° C.).

As V1 continues to rise past V1-thresh=2 volts, rail V2 is in an unknown state for a brief period of time while $V_{Enable}$ rises between 0.3 and 1.3 volts. This is because regulator 104 parameters (for part number NCP5662DS18R4G) specify that regulation of 1.8 volts at Vout, pin 4 (i.e., V2) is not assured until $V_{Enable}$ reaches 1.3 volts. However, as rail V1 continues to rise and Q1 quickly saturates, $V_{Enable}$ quickly reaches 1.3 volts which turns on regulator 104, thus turning on V2 by regulating 1.8 volts at Vout, pin 4. Therefore, as shown in FIG. 3, upon power up under both temperature extremes (i.e., 50° C. and 0° C.), rail V2 is held in an off condition at least until rail V1 reaches V1-thresh=2 volts (which exceeds the manufacturers specified minimum of 1.8 volts). V2 is then turned on once V1 is clearly above the manufacturers specified minimum of 1.8 volts and $V_{Enable}$ reaches 1.3 volts.

In the example embodiment illustrated in FIGS. 2 and 3, once the power sequencing circuit 100 is fully powered up, apparatus 200 operates as specified with voltage rail V1 supplying 3.3 volts to load #1 (202) and voltage rail V2 supplying 1.8 volts to load #2 (204).

On power down, as voltage rail V1 drops, Vbe experiences a corresponding voltage drop based on the voltage divider ratio R1/(R1+R2), which reduces the Q1 collector current through R3. As the Q1 collector current through R3 drops, the $V_{Enable}$ threshold voltage (FIG. 3; shown at both 50° C. and 0° C.) drops down to 1.3 volts, which is the first point at which regulator U1 might drop out of regulation. When the enable pin (pin 1) ($V_{Enable}$) is between 1.3 and 0.3 volts, the status of the regulator U1, and consequently voltage rail V2, are unknown. However, as FIG. 3 illustrates, once rail V1 drops down to 2 volts, the enable pin (pin 1) ($V_{Enable}$) is below 0.3 volts which ensures that the regulator U1, and consequently voltage rail V2, are off. Accordingly, as the circuit is powered down, the voltage rail V2 is always off before V1 drops below 1.8 volts, meeting the requirement specified by the manufacturer of apparatus 200.

Second Illustrative Embodiment

Figure 4:
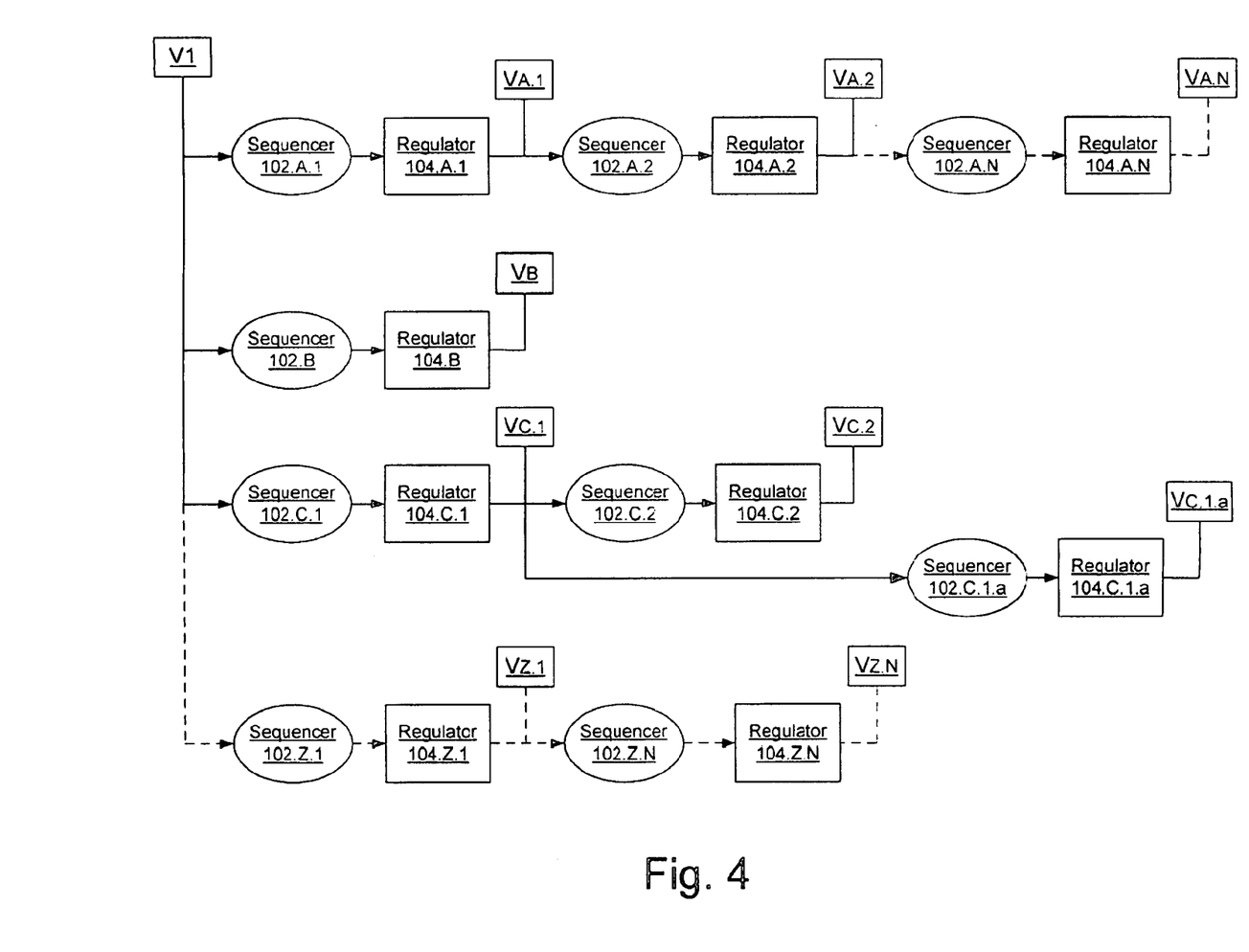
FIG. 4 shows cascading configurations of power sequencing circuits in series and/or parallel implementations according to various embodiments.

FIG. 4 shows a cascading configuration of power sequencing circuits in series and/or parallel implementations according to various embodiments. The cascading configuration of power sequencing circuits illustrated in FIG. 4 is not intended to limit the number or types of configurations to the particular embodiment shown, but is instead intended to show that various extended and/or reduced configurations can result in numerous embodiments.

Figure 5:
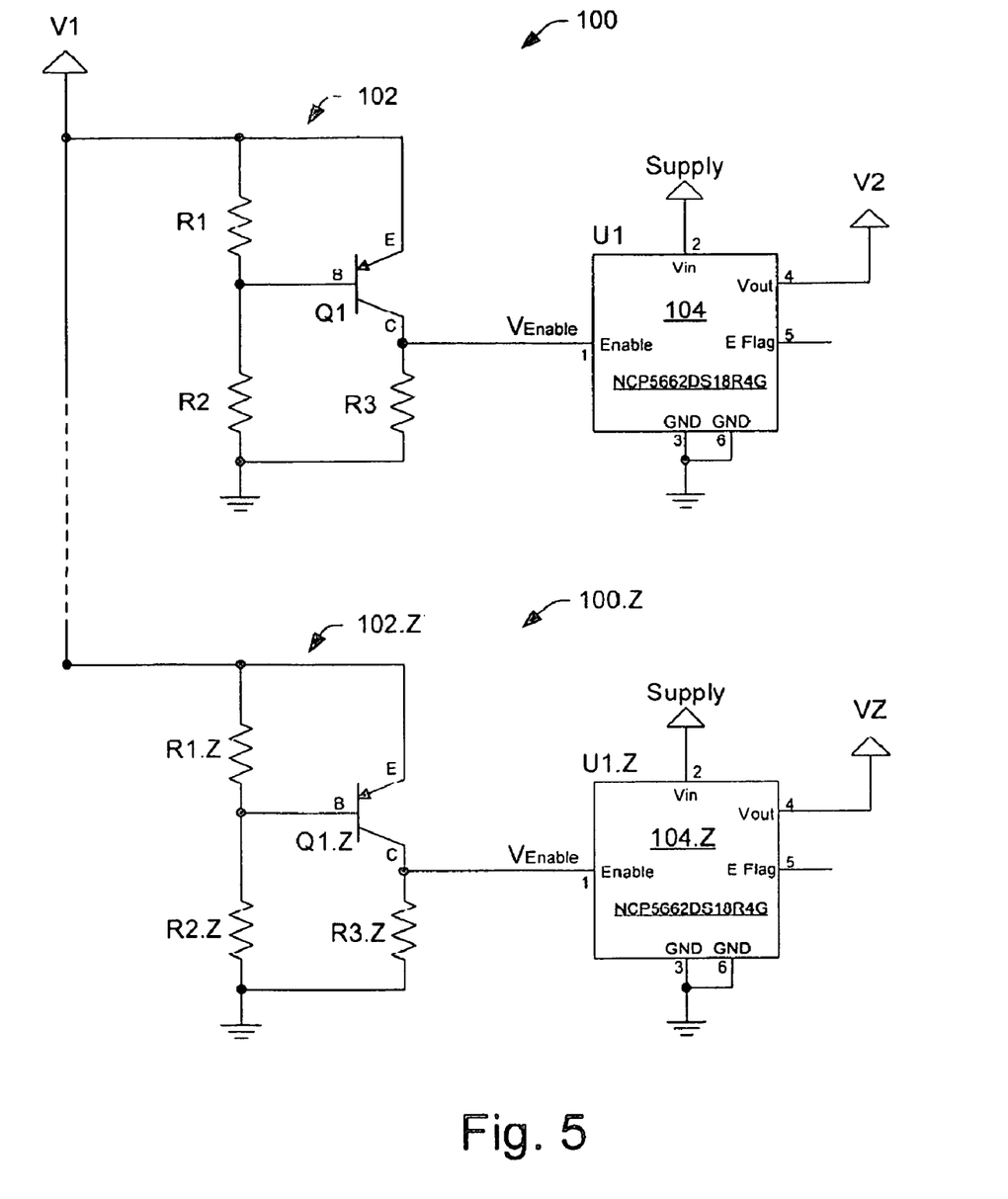
FIG. 5 shows two power sequencing circuits coupled in a parallel configuration according to an embodiment.

In FIG. 4, voltage rail V1 may supply numerous sequencer circuits 102.A.1-102.Z.1. Each of the sequencer circuits 102.A.1-102.Z.1 drives at least a logic enabled regulator 104, such as regulators 104.A.1-104.Z.1, respectively. A cascading power sequencing circuit configured such that the same voltage rail (e.g., V1) supplies numerous sequencer circuits is said to be coupled in a parallel configuration. FIG. 5 illustrates in more detail, an example configuration of two power sequencing circuits coupled in parallel with the same voltage rail V1. A parallel configuration can continue on to Z number of power sequencer circuits.

Figure 6:
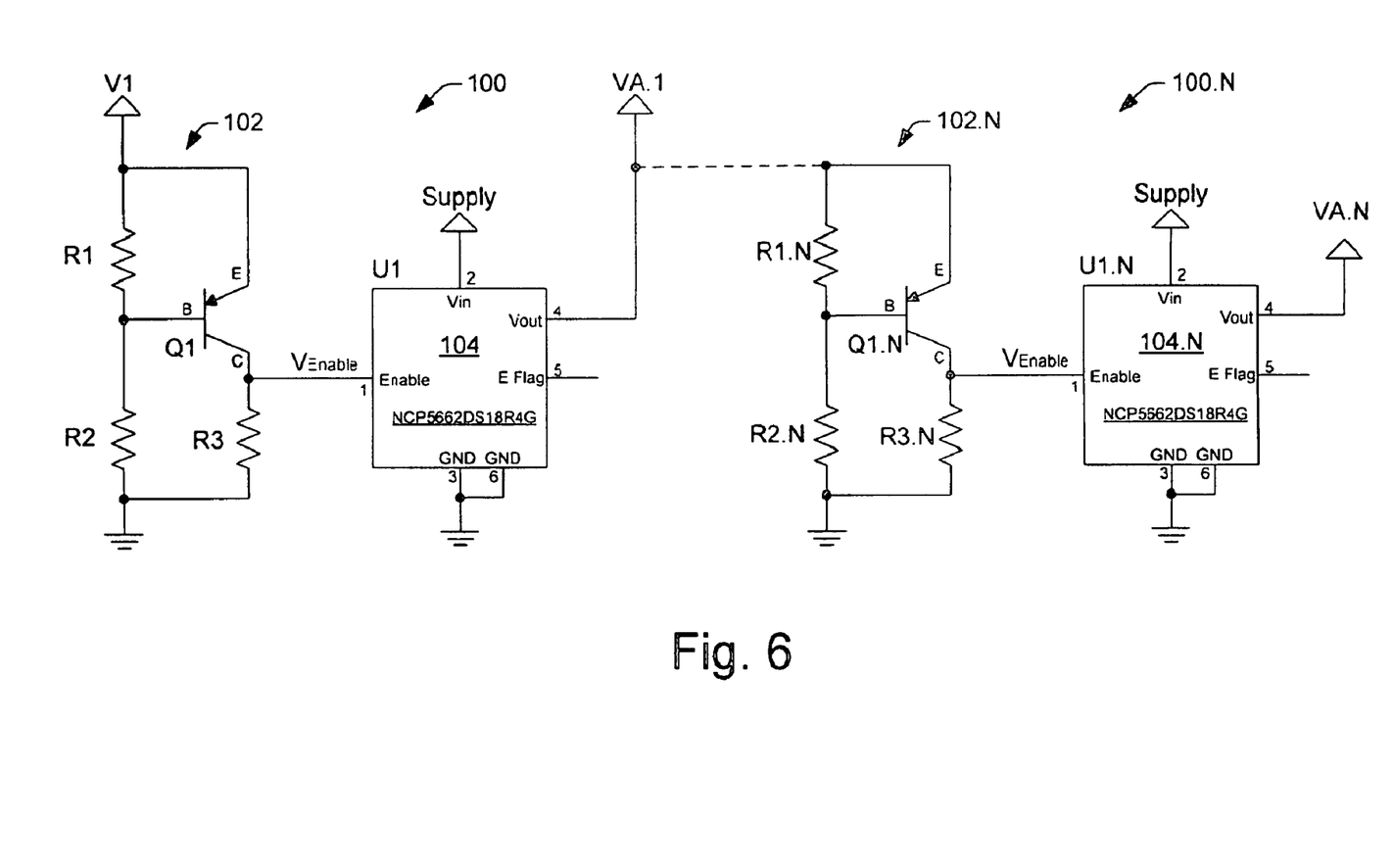
FIG. 6 shows two power sequencing circuits coupled in a series configuration according to an embodiment.

Referring again to FIG. 4, a voltage rail V1 may supply a single sequencer circuit such as sequencer 102.A.1. The sequencer 102.A.1 drives at least a logic enabled regulator 104, such as regulator 104.A.1, which regulates a second voltage rail VA.1. In a series configuration, rail VA.1 can then supply another sequencer circuit such as sequencer 102.A.2. Note that a second voltage rail such as VA.1 might also supply additional sequencer circuits in a parallel configuration such as discussed above with reference to voltage rail V1. An example of this is shown in FIG. 4 by voltage rail VC.1 supplying sequencer 102.C.2 in a series configuration in addition to supplying sequencer 102.C.1.a in a parallel configuration. FIG. 6 illustrates in more detail, an example configuration of two power sequencing circuits coupled in series through a second, regulated voltage rail, VA.1. A series configuration can continue on to N number of power sequencer circuits.

Third Illustrative Embodiment

Figure 7:
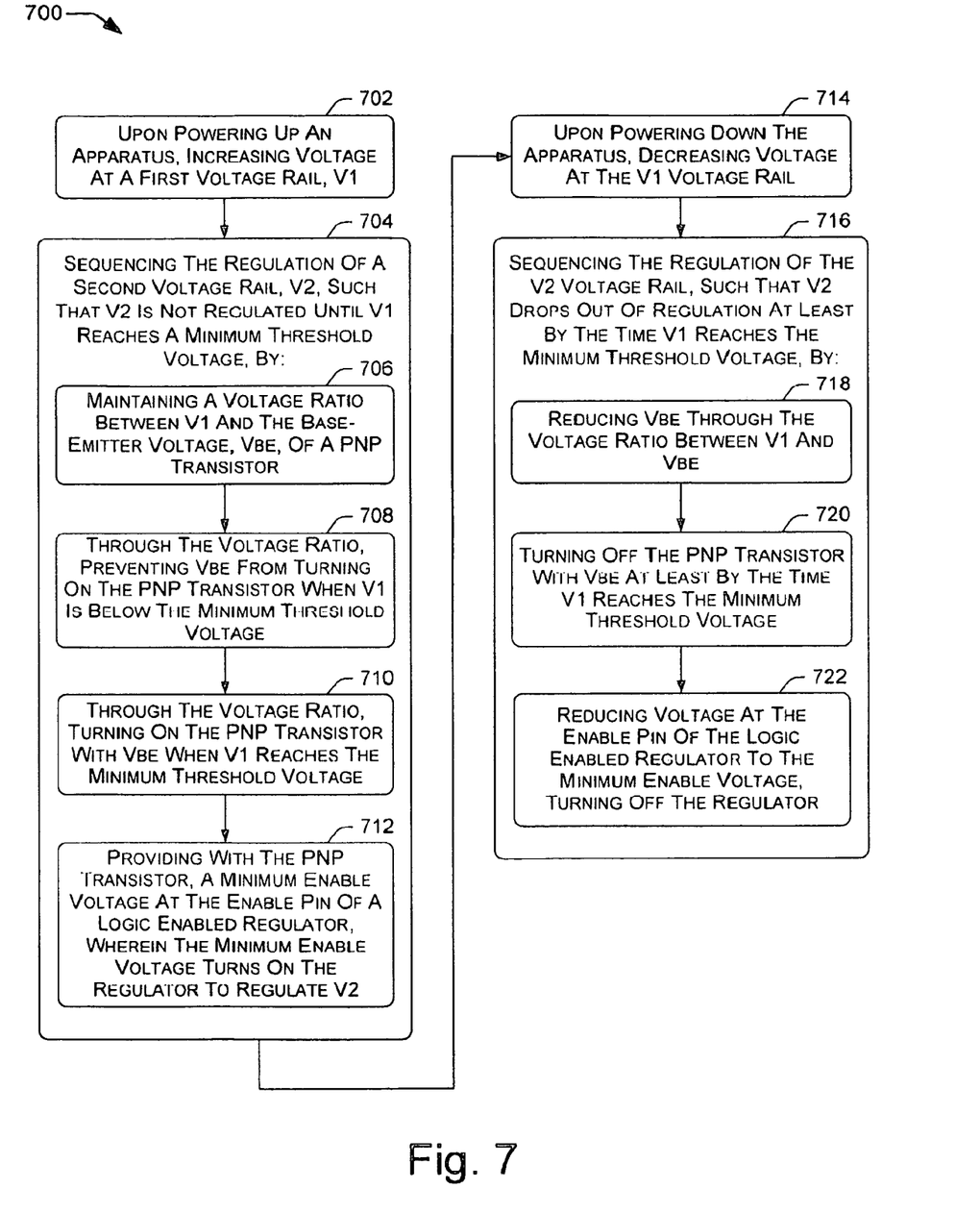
FIG. 7 depicts a flowchart of a method according to an embodiment.

FIG. 7 is a flowchart illustrating a method 700 of power sequencing voltage rails in a device such as a computer, printer, liquid crystal display, etc., that uses multiple DC voltage levels that must be powered on, and/or off, in a specific sequence. The method 700 is described in general relation to the power sequencing circuit 100 of FIGS. 1-3 that have been described above.

Method 700 begins at block 702 with the powering on of an apparatus or device such as a computer, printer, liquid crystal display, etc., that uses multiple DC voltage levels. At block 702, the voltage at a first voltage rail V1, is increased upon powering up the device. At block 704, the regulation or-turning on of a second voltage rail V2, is sequenced with respect to V1 such that V2 is not regulated until V1 reaches a minimum threshold voltage.

The sequencing of V2 with respect to V1 in a power sequencing circuit 100 includes maintaining a voltage divider ratio between V1 and the base-emitter voltage, Vbe, of a PNP transistor, as shown at block 706. As discussed above, once a minimum threshold voltage for V1 (i.e., V1-thresh) is set to meet the manufacturer's specification, suitable values for resistors can be determined from the equation, R1/(R1+R2) =Vbe/V1-thresh, that maintain the Vbe/V1-thresh voltage ratio and configure the PNP transistor Q1 as a switch that properly controls when V2 is regulated (i.e., turned on).

As shown at block 708, through the voltage ratio set by resistors R1 and R2, Vbe is prevented from turning on the transistor Q1 while V1 is still below the minimum threshold voltage, V1-thresh. While the V1 voltage continues to rise, Vbe also rises according to the voltage divider ratio, and Vbe turns on the PNP transistor when V1 rises to the minimum threshold voltage, V1-thresh, as shown at block 710. At block 712, the collector current from the turned on PNP transistor provides the minimum enable voltage across resistor R3 needed at the enable pin of a logic enabled regulator to turn on the regulator, thus regulating V2.

The method continues at block 714 with the powering down of the device. Upon power down, the voltage at rail V1 is decreased. As noted at block 716, the regulation of V2 with respect to V1 is sequenced such that V2 drops out of regulation (i.e., turns off) at least by the time voltage rail V1 reaches the minimum threshold voltage, V1-thresh.

The sequencing of V2 with respect to V1 on powering down the power sequencing circuit 100 includes reducing Vbe through the voltage divider ratio between V1 and Vbe, as shown at block 718. The voltage divider ratio ensures that Vbe turns off the PNP transistor at least by the time V1 reaches the minimum threshold voltage, V1-thresh, as shown at block 720. As shown at block 722, turning off the transistor reduces the voltage at the enable pin of the logic enabled regulator down to the minimum enable voltage, which turns off the voltage regulator, dropping V2 out of regulation.

The method 700 shows that upon power up, the power sequencing circuit 100 does not permit voltage rail V2 to reach its nominal, regulated value until voltage rail V1 meets or exceeds a minimum threshold value determined from the manufacturer's specification. The method 700 further shows that upon power down, the power sequencing circuit 100 ensures that voltage rail V2 is dropped out of regulation (i.e., turned off) prior to voltage rail V1 being allowed to drop below the minimum threshold value determined from the manufacturer's specification.

What is claimed is:

1. A power sequencing circuit, comprising:
a voltage (V1) coupled at a first node to an emitter of a PNP transistor (Q1);
a first resistor (R1) coupled between the first node and a base of (Q1);
a second resistor (R2) coupled between the base and a grounded node;
a third resistor (R3) coupled between the grounded node and a collector of Q1;
a logic enabled regulator (U1) having an enable pin (P1) coupled to and driven by the collector;
a voltage divider ratio of R1 to R1 plus R2 which maintains an output voltage (V2) of U1 in an off condition until V1 rises above a first threshold (V1thresh);
a base-emitter voltage (Vbe) of Q1 metered to V1 by the voltage divider and thereby maintained below a Q1 turn-on voltage (Von) until V1 rises above V1thresh; and
an enable voltage (Venable) associated with P1, wherein U1 does not regulate V2 until a voltage at P1 reaches the enable voltage.

2. A power sequencing circuit according to claim 1, wherein the collector of Q1 maintains the voltage at P1 below Venable until V1 rises above V1thresh.

3. A power sequencing circuit according to claim 1, wherein Vbe turns on Q1 when V1 rises above V1 thresh and P1 rises above Venable which turns on V2.

4. An apparatus, comprising:
a plurality of power sequencing circuits each comprising:
a voltage coupled at a first node to an emitter of a PNP transistor;
a first resistor coupled between the first node and a base of the transistor;
a second resistor coupled between the base and a grounded node;
a third resistor coupled between the grounded node and a collector of the transistor; and,
a logic enabled regulator having an enable pin coupled to and driven by the collector;
wherein the voltage in a second power sequencing circuit is coupled to and driven by an output voltage from the logic enabled regulator of a first power sequencing circuit, thereby coupling the first and second circuits in series with one another.

5. An apparatus according to claim 4, wherein the voltage in a third power sequencing circuit is coupled to and driven by the output voltage from the logic enabled regulator of the first power sequencing circuit, thereby coupling the second and third circuits in parallel with one another.

6. An apparatus according to claim 4, wherein the voltage in the first and second power sequencing circuits is the same voltage, thereby coupling the first and second power sequencing circuits in parallel.

7. An apparatus according to claim 6, wherein the voltage in a third power sequencing circuit is coupled to and driven by the output voltage from the logic enabled regulator of the second power sequencing circuit, thereby coupling the second and third circuits in series with one another.

8. A method of power sequencing voltage rails, comprising:
increasing a voltage at a first voltage rail (V1); and
first sequencing a second voltage rail (V2) with respect to V1 such that V2 is not regulated until V1 reaches a minimum threshold voltage, the first sequencing comprising driving an enable pin of a logic enabled regulator with a PNP transistor switch to control when regulation of V2 occurs.

9. The method of claim 8, wherein the first sequencing further comprises:
maintaining a voltage divider ratio between V1 and a base-emitter voltage (Vbe) of the transistor; and
preventing Vbe from turning on the transistor when V1 is below the minimum threshold voltage and causing Vbe to turn on the transistor when V1 reaches the minimum threshold voltage.

10. The method of claim 8, wherein causing Vbe to turn on the transistor comprises providing a minimum enable voltage at the enable pin of the logic enabled regulator, the minimum enable voltage enabling the logic enabled regulator to regulate V2.

11. The method of claim 8, comprising:
after increasing the voltage at V1, decreasing the voltage at V1; and
second sequencing the second voltage rail V2 with respect to V1 such that V2 drops out of regulation at least by the time V1 reaches the minimum threshold voltage, the second sequencing comprising driving the enable pin of the logic enabled regulator with the PNP transistor switch to control when V2 drops out of regulation.

12. The method of claim 11, wherein the second sequencing further comprises:
as V1 decreases, reducing Vbe through the voltage divider ratio;
turning off the transistor with Vbe when V1 at least reaches the minimum threshold voltage; and
in response to turning off the transistor, reducing voltage at the enable pin of the logic enabled regulator and turning off the regulator.

* * * * *

UNITED STATES PATENT AND TRADEMARK OFFICE
CERTIFICATE OF CORRECTION

PATENT NO. : 7,915,931 B2 Page 1 of 1
APPLICATION NO. : 12/361696
DATED : March 29, 2011
INVENTOR(S) : Jerry Fox et al.

It is certified that error appears in the above-identified patent and that said Letters Patent is hereby corrected as shown below:

In column 7, line 34, in Claim 1, delete "and" and insert -- and, --, therefor.

In column 7, line 41, in Claim 3, delete "V1 thresh" and insert -- V1thresh --, therefor.

Signed and Sealed this
Fifth Day of July, 2011

David J. Kappos
*Director of the United States Patent and Trademark Office*